(12) United States Patent
Kim

(10) Patent No.: US 10,593,417 B2
(45) Date of Patent: Mar. 17, 2020

(54) MEMORY SYSTEM AND OPERATING METHOD FOR THE SAME

(71) Applicant: SK hynix Inc., Gyeonggi-do (KR)

(72) Inventor: Jee-Yul Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 36 days.

(21) Appl. No.: 15/461,571

(22) Filed: Mar. 17, 2017

(65) Prior Publication Data

US 2018/0053565 A1    Feb. 22, 2018

(30) Foreign Application Priority Data

Aug. 19, 2016  (KR) .................. 10-2016-0105450

(51) Int. Cl.
| | | |
|---|---|---|
| *G11C 29/00* | (2006.01) | |
| *G11C 29/08* | (2006.01) | |
| *G11C 29/02* | (2006.01) | |
| *G06F 11/10* | (2006.01) | |
| *G11C 16/34* | (2006.01) | |
| *G11C 29/50* | (2006.01) | |
| *G11C 29/52* | (2006.01) | |
| G11C 29/42 | (2006.01) | |

(52) U.S. Cl.
CPC .......... *G11C 29/08* (2013.01); *G06F 11/1048* (2013.01); *G11C 16/3454* (2013.01); *G11C 29/028* (2013.01); *G11C 29/50012* (2013.01); *G11C 29/52* (2013.01); *G11C 29/42* (2013.01)

(58) Field of Classification Search
CPC ... G11C 16/107; G11C 16/16; G11C 16/3404; G11C 16/3436; G11C 16/0483; G11C 16/10; G11C 16/26; G11C 16/3454; G11C 29/08; G11C 29/52; G11C 29/028; G11C 29/50012; G11C 29/42; G06F 3/0608; G06F 3/064; G06F 3/065; G06F 3/0652; G06F 3/0679

See application file for complete search history.

(56) References Cited

U.S. PATENT DOCUMENTS

| | | | | |
|---|---|---|---|---|
| 8,677,203 | B1* | 3/2014 | Shalvi | G06F 11/14 |
| | | | | 714/747 |
| 2007/0159890 | A1 | 7/2007 | Cho | |
| 2008/0082736 | A1* | 4/2008 | Chow | G06F 12/0246 |
| | | | | 711/103 |
| 2010/0306582 | A1* | 12/2010 | Han | G06F 11/1068 |
| | | | | 714/6.13 |
| 2012/0272120 | A1 | 10/2012 | Chen | |
| 2013/0080858 | A1* | 3/2013 | Lee | G11C 16/26 |
| | | | | 714/773 |
| 2013/0145079 | A1 | 6/2013 | Lee et al. | |
| 2014/0376315 | A1* | 12/2014 | Park | G11C 16/26 |
| | | | | 365/185.21 |

(Continued)

*Primary Examiner* — Guerrier Merant
(74) *Attorney, Agent, or Firm* — IP & T Group LLP

(57) ABSTRACT

A memory system comprises a memory device including a plurality of memory blocks, the memory device being configured to perform a program operation and a program verify operation to program data to the memory blocks, and a controller configured to detect program error bit information as a result of the program verify operation, select a victim memory block among the memory blocks based on the detected program error bit information, and copy programmed data of the victim memory block.

18 Claims, 9 Drawing Sheets

(56) References Cited

U.S. PATENT DOCUMENTS

| | | | |
|---|---|---|---|
| 2015/0113305 A1* | 4/2015 | Shin | G06F 1/3275 |
| | | | 713/322 |
| 2015/0194220 A1* | 7/2015 | Yang | G11C 16/107 |
| | | | 365/185.12 |
| 2015/0277792 A1* | 10/2015 | Ma | G06F 3/0619 |
| | | | 711/103 |
| 2016/0019111 A1* | 1/2016 | Kochar | G06F 11/1068 |
| | | | 714/6.12 |
| 2017/0010944 A1* | 1/2017 | Saito | G06F 3/0614 |

* cited by examiner

MEMORY SYSTEM AND OPERATING METHOD FOR THE SAME

CROSS-REFERENCE TO RELATED APPLICATION

The present application claims priority under 35 U.S.C. § 119(a) to Korean Patent Application No. 10-2016-0105450 filed on Aug. 19, 2016 in the Korean Intellectual Property Office, the disclosure of which is incorporated herein by reference in its entirety.

TECHNICAL FIELD

Exemplary embodiments relate to a memory system including a memory device configured to perform a program operation and a program verify operation, and an operating method for the memory system.

DISCUSSION OF THE RELATED ART

The computer environment paradigm has changed to ubiquitous computing systems that can be used anytime and anywhere. Due to this, use of portable electronic devices such as mobile phones, digital cameras, and notebook computers has rapidly increased. These portable electronic devices generally use a memory system having memory devices, for data storage. The memory system may be used as a main memory device or an auxiliary memory device of a portable electronic device.

Memory systems using memory devices provide excellent stability, durability, high information access speed, and low power consumption, because they have no moving parts. Examples of memory systems having such advantages include universal serial bus (USB) memory devices, memory cards having various interfaces, and solid-state drives (SSD).

SUMMARY

Various embodiments are directed to an improved memory system and an operating method thereof that manage error information about data programmed in a memory device employed by the memory system to prevent an error from occurring in the data and to stably store the data.

In accordance with an embodiment of the present invention, a memory system includes: a memory device including a plurality of memory blocks, the memory device being configured to perform a program operation and a program verify operation to program data to the memory blocks; and a controller configured to detect program error bit information as a result of the program verify operation, select a victim memory block among the memory blocks based on the detected program error bit information, and copy programmed data of the victim memory block.

The program error bit information may include a number of program error bits detected through the program verify operation for each page of the respective memory blocks to which the program and program verify operations are performed.

The controller may include a program error management unit configured to manage the number of program error bits of each page, and sum up the numbers of program error bits of each page for the respective memory blocks.

The controller may further include: a read time management unit configured to measure a read operation time for a read operation performed for the respective memory blocks; and a read count management unit configured to count a read operation count for the read operation performed for the respective memory blocks.

The controller may select the victim memory block among the plurality of memory blocks based on the number of program error bits and on at least one of the read operation time and the read operation count.

The controller may select a memory block having a longest read operation time or a largest read operation count and having the number of program error bits equal to or more than a threshold value as the victim memory block among the plurality of memory blocks.

When copying the data of the victim memory block, the controller may read the data of the victim memory block and program the read data to a free memory block among the plurality of memory blocks without performing an ECC (Error Correction Code) operation.

When reading the data of the victim memory block, the controller may read valid data among the data of the victim memory block through a garbage collection operation.

The memory device may include: a voltage supply circuit configured to supply an operating voltage to the memory blocks according to the program operation or the program verify operation; a read/write circuit configured to drive and sense potentials of corresponding bit lines of the memory blocks according to the program operation or the program verify operation; and a control circuit configured to control the voltage supply circuit and the read/write circuit.

The read/write circuit may include a plurality of page buffers coupled with memory cells through the corresponding bit lines, wherein, during the program verify operation, the page buffers may change potentials of a plurality of sense nodes depending on a verification result of corresponding memory cells.

During the program verify operation, the control circuit may count sense nodes that are not changed in potential among the plurality of sense nodes, and determine whether the program operation is successful by comparing the number of counted sense nodes with a reference number of bits.

During the program verify operation, the control circuit may count sense nodes that are not changed in potential among the plurality of sense nodes, and output the number of counted sense nodes to the controller as the program error bit information.

In accordance with an embodiment of the present invention, an operating method for a memory system includes: performing a program operation and a program verify operation to program data to a plurality of memory blocks; detecting program error bit information as a result of the program verify operation; selecting a victim memory block among the plurality of memory blocks based on the detected program error bit information; and copying data of the victim memory block.

The program error bit information may include a number of program error bits detected through the program verify operation for each page of the respective memory blocks to which the program and program verify operations are performed.

The detecting of the program error bit information may include: managing the number of program error bits of each page; and summing up the numbers of program error bits of each page for the respective memory blocks.

The selecting of the victim memory block may include: measuring a read operation time taken for the respective memory blocks, or counting a read operation count performed for the respective memory blocks; selecting memory blocks having the number of program error bits equal to or more than a threshold value among the plurality of memory blocks; and selecting a memory block having a longest read operation time or a largest read operation count as the victim memory block among the selected memory blocks.

The copying of the data of the victim memory block may be performed without performing an error correction operation to the data of the victim memory block.

The copying of the data of the victim memory block may be performed by copying valid data among the data of the victim memory block by a garbage collection operation.

In accordance with an embodiment of the present invention, a data processing system includes: a host operatively coupled to the memory system, wherein the memory system is configured as at least one of a solid-state drive, an embedded multimedia card, a universal flash storage, and a user system.

The memory device may be a nonvolatile memory device selected from the group consisting of a read only memory (ROM), a mask ROM (MROM), a programmable ROM (PROM), an erasable programmable ROM (EPROM), an electrically erasable programmable ROM (EEPROM), a ferroelectric random access memory (FRAM), a phase-change RAM (PRAM), a magnetoresistive RAM (MRAM), a resistive RAM (RRAM), and a flash memory.

BRIEF DESCRIPTION OF THE DRAWINGS

These and other features and advantages of the present invention will become apparent to persons skilled in the art to which this invention pertains from the following detailed description of various embodiments of the present invention in reference to the accompanying drawings, wherein.

DETAILED DESCRIPTION

Figure 1:
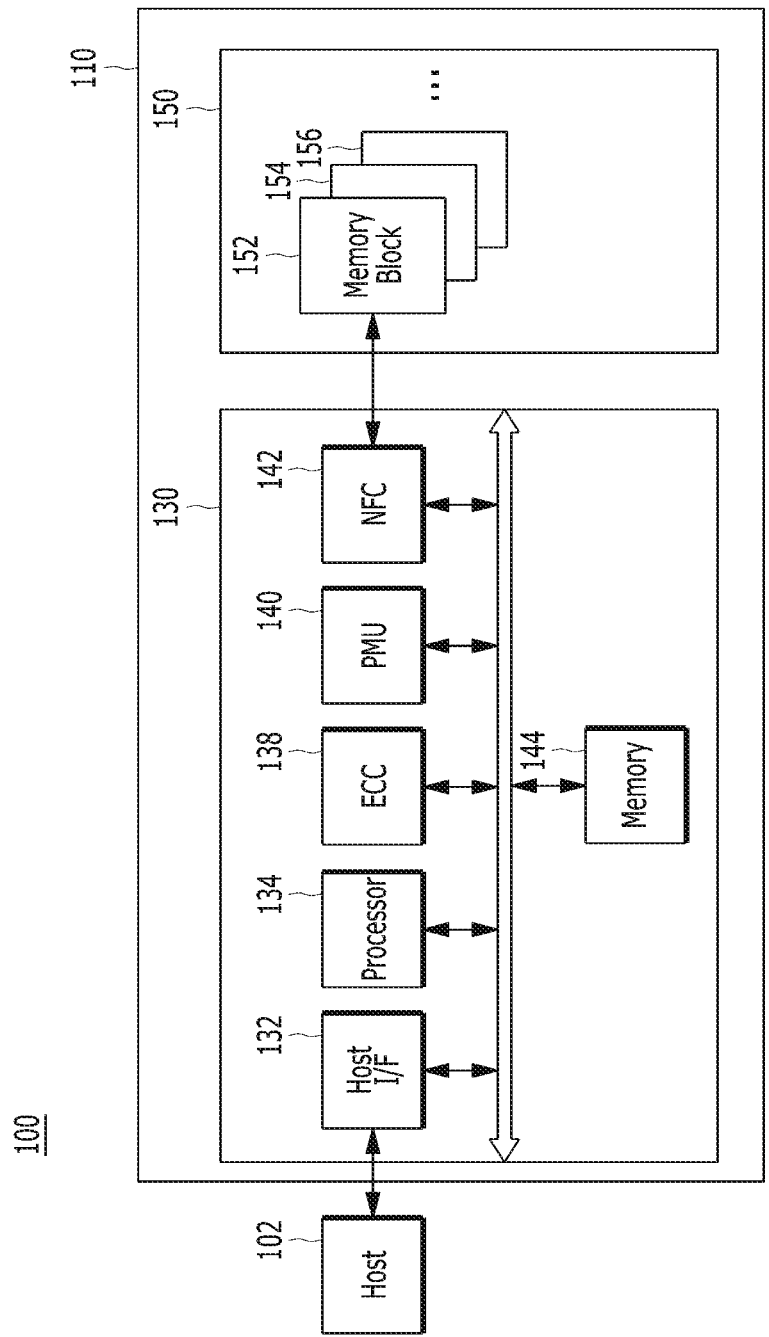
FIG. 1 is a block diagram illustrating a data processing system, according to an embodiment of the present invention.

Although, various embodiments are described below in more detail with reference to the accompanying drawings, we note that the present invention may be embodied in different forms and should not be construed as being limited only to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

We further note that in the following description, numerous specific details are set forth in for providing a thorough understanding of the present invention. However, as would be apparent to those skilled in the relevant art, the present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described with reference to the attached drawings.

Referring now to FIG. 1, a data processing system 100 including a memory system 110 is provided, according to an embodiment of the present invention.

The data processing system 100 may include a host 102 operatively coupled to the memory system 110.

For example, the host 102 may include a portable electronic device such as a mobile phone, an MP3 player and a laptop computer or a non-portable electronic device such as a desktop computer, a game player, a television (TV) and a projector.

The memory system 110 may operate in response to a request received from the host 102. For example, the memory system 110 may store data to be accessed by the host 102. The memory system 110 may be used as a main memory system or an auxiliary memory system of the host 102. The memory system 110 may be implemented with any one of various storage devices, according to the protocol of a host interface to be coupled electrically with the host 102. The memory system 110 may be implemented with any one of various storage devices, such as, for example, a solid-state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device, such as, a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase-change RAM (PRAM), a magnetoresistive RAM (MRAM), a resistive RAM (RRAM), and a flash memory.

The memory system 110 may include a memory device 150 for storing data to be accessed by the host 102, and a controller 130 operatively coupled to the memory device 150 for controlling the storage of data in the memory device 150 and the transfer of stored data from the memory device 150 to the host 102.

The controller 130 and the memory device 150 may be integrated into a single semiconductor device. For instance, the controller 130 and the memory device 150 may be integrated into a single semiconductor device configured as a solid-state drive (SSD). When the memory system 110 is used as an SSD, the operation speed of the host 102 that is electrically coupled with the memory system 110 may be significantly increased.

The controller 130 and the memory device 150 may be integrated into a single semiconductor device configured as a memory card, such as, for example, a Personal Computer Memory Card International Association (PCMCIA) card, a compact flash (CF) card, a smart media card (SMC), a memory stick, a multimedia card (MMC), an RS-MMC, a micro-MMC, a secure digital (SD) card, a mini-SD, a micro-SD, an SDHC, and a universal flash storage (UFS) device.

For another instance, the memory system 110 may be configured as part of a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device 150 of the memory system 110 may retain stored data when power supply to the device is interrupted. For example, the memory device 150 may store the data provided from the host 102 during a write operation, and provide stored data to the host 102 during a read operation. The memory device 150 may include a plurality of memory blocks 152, 154 and 156. Each of the memory blocks 152, 154 and 156 may include a plurality of pages. Each of the pages may include a plurality of memory cells electrically coupled to a word line (WL) (See FIG. 3). The memory device 150 may be a nonvolatile memory device such as a flash memory. The flash memory may have a three-dimensional (3D) stack structure.

The controller 130 of the memory system 110 may control the memory device 150 in response to a request from the host 102. For example, upon receiving a read request from the host 102, the controller 130 may issue a read command and an address to the memory device for reading the data which are stored in the requested address in the memory device and may provide the data read from the memory device 150, to the host 102. Also, in response to a program request (also referred to as a write request) received from the host 102, the controller 130 may issue a write command, an address and write data and may control the operation of the memory device for storing the write data into the memory device 150. The write data are provided from the host 102 to the memory controller together with the write request. The controller 130 may control one or more operations of the memory device 150 including a read operation, a write operation and an erase operation. The controller 130 may also control one or more background operations of the memory device 150 including, for example, a wear leveling operation, and a garbage operation.

According to the illustrated embodiment of FIG. 1, the controller 130 may include a host interface unit 132, a processor 134, an error correction code (ECC) unit 138, a power management unit (PMU) 140, a NAND flash controller (NFC) 142, and a memory 144 operatively coupled to an internal bus.

The host interface unit 132 provides an interface between the host 102 and the controller 130. For example, the host interface unit 132 may receive and process requests, addresses and data provided from the host 102. The host interface unit 132 may also transmit read data from the memory device to the host 102. The host interface unit 132 may communicate with the host 102 through at least one of various well-known interface protocols such as a universal serial bus (USB), a multimedia card (MMC), a peripheral component interconnect-express (PCI-E), a serial attached SCSI (SAS), a serial advanced technology attachment (SATA), a parallel advanced technology attachment (PATA), a small computer system interface (SCSI), an enhanced small disk interface (ESDI), and an integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low-density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 may provide and manage power for the controller 130, for example, power for the component elements included in the controller 130. Any suitable PMU may be employed.

The NFC 142 may serve as a memory interface between the controller 130 and the memory device 150 to allow the controller 130 to control the memory device 150 in response to a request from the host 102. The NFC 142 may generate control signals for the memory device 150 and process data under the control of the processor 134 when the memory device 150 is a flash memory. For example, the NFC 142 may generate control signals for the memory device 150 and process data under the control of the processor 134 when the memory device 150 is a NAND flash memory.

The memory 144 may serve as a working memory of the memory system 110 and the controller 130, and store data for driving the memory system 110 and the controller 130. The controller 130 may control the memory device 150 in response to a request from the host 102. For example, the controller 130 may provide the data read from the memory device 150 to the host 102 and store the data provided from the host 102 in the memory device 150. When the controller 130 controls the operations of the memory device 150, the memory 144 may store data used by the controller 130 and the memory device 150 for such operations as read, write, program and erase operations.

The memory 144 may be implemented with a volatile memory. For example, the memory 144 may be implemented with a static random access memory (SRAM) or a dynamic random access memory (DRAM). As described above, the memory 144 may store data used by the host 102 and the memory device 150 for the read and write operations. To store the data, the memory 144 may include a program memory, a data memory, a write buffer, a read buffer, a map buffer, and so forth.

The processor 134 may control an operation of the memory system 110. For example, the processor 134 may control a write operation or a read operation for the memory device 150, in response to a write request or a read request from the host 102. The processor 134 may drive firmware, which is referred to as a flash translation layer (FTL), to control an operation of the memory system 110. In an embodiment, the processor 134 may be implemented with a microprocessor. In another embodiment, the processor 134 may be implemented with a central processing unit (CPU).

A management unit (not shown) may be included in the processor 134 for performing a bad block management operation of the memory device 150. The management unit may find bad memory blocks included in the memory device 150, which are in unsatisfactory condition for further use, and perform bad block management on the bad memory blocks. When the memory device 150 is a flash memory, such as a NAND flash memory, a program failure may occur during the write operation (or program operation), due to characteristics of a NAND logic function. During the bad block management, the data of the program-failed memory block or the bad memory block may be programmed into a new memory block. Reliable bad block management may reduce deterioration of the utilization efficiency and increase the reliability of the memory device 150.

Figure 2:
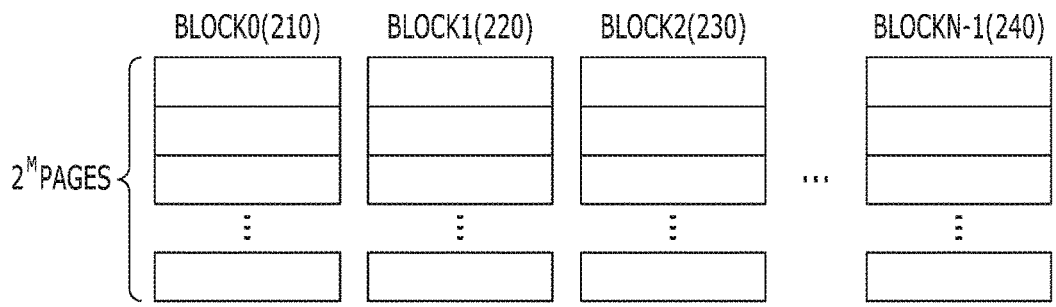
FIG. 2 is a schematic diagram illustrating a memory device of FIG. 1.

FIG. 2 is a schematic diagram illustrating the memory device 150 of FIG. 1.

Referring to FIG. 2, the memory device 150 may include a plurality of memory blocks. For example, the memory device 150 may include zeroth to $(N-1)^{th}$ blocks 210 to 240. Each of the plurality of memory blocks 210 to 240 may include a plurality of pages. For example, each of the plurality of memory blocks 210 to 240 may include $2^M$ number of pages ($2^M$ PAGES), to which the present invention will not be limited. M and N are natural numbers. Each of the plurality of pages may include a plurality of memory cells which are electrically coupled to a word line.

The memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. An MLC memory block may include a plurality of pages which are implemented with memory cells each capable of storing multi-bit data (e.g., two or more-bit data). An MLC memory block including a plurality of pages which are implemented with memory cells that are each capable of storing 3-bit data may be defined as a triple level cell (TLC) memory block.

Each of the plurality of memory blocks 210 to 240 may store the data provided from the host 102 during a write operation. Also, each of the plurality of memory blocks may provide stored data to the host 102 during a read operation.

Figure 3:
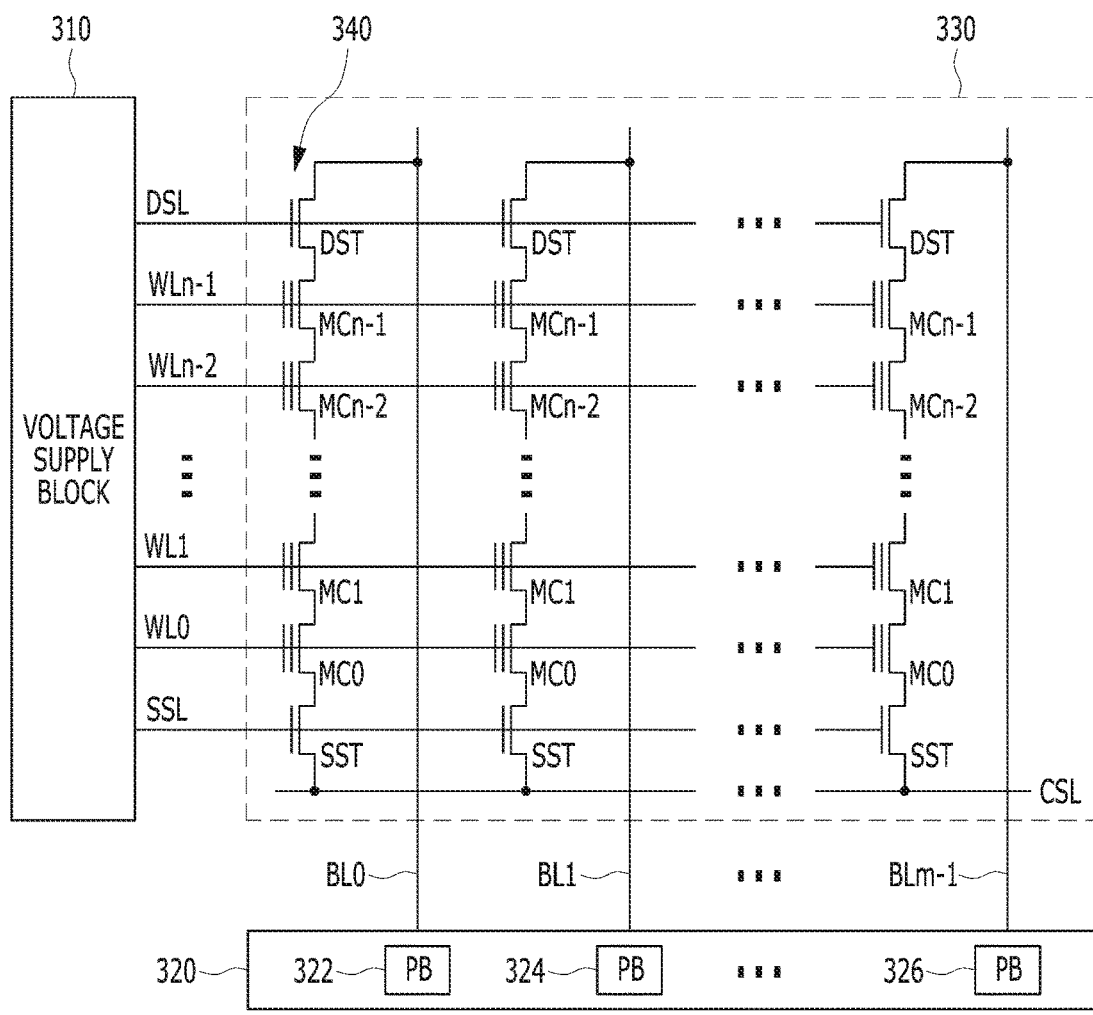
FIG. 3 is a circuit diagram illustrating an exemplary configuration of a memory block employed in the memory device of FIG. 1.

FIG. 3 is a circuit diagram illustrating one of the plurality of memory blocks 152 to 156 of FIG. 1.

Referring to FIG. 3, the memory block 330 of the memory device 150 may include a plurality of cell strings 340 which are implemented into a memory cell array and are coupled to a plurality of bit lines BL0 to BLm−1. Each of the cell strings 340 of each column may include at least one drain select transistor DST and at least one source select transistor SST. A plurality of memory cells or memory cell transistors MC0 to MCn−1 may be coupled in series between the select transistors SST and DST. The respective memory cells MC0 to MCn−1 may be constructed by multi-level cells (MLC) each of which stores information of a plurality of bits. Each of the cell strings 340 may be electrically coupled to a corresponding bit line among the plurality of bit lines BL0 to BLm−1 For reference, in FIG. 3, 'DSL' denotes a drain select line, 'SSL' denotes a source select line, and 'CSL' denotes a common source line.

While FIG. 3 shows, as an example, the memory block 330 which is constructed by NAND flash memory cells, it is to be noted that the memory block 330 of the memory device 150 according to the embodiment is not limited to a NAND flash memory and may be realized by a NOR flash memory, a hybrid flash memory in which at least two kinds of memory cells are combined or a one-NAND flash memory in which a controller is built in a memory chip. The operational characteristics of a semiconductor device may be applied to not only a flash memory device in which a charge storing layer is constructed by conductive floating gates but also a charge trap flash (CTF) in which a charge storing layer is constructed by a dielectric layer.

A voltage supply block 310 of the memory device 150 may provide word line voltages (for example, a program voltage, a read voltage and a pass voltage) to be supplied to respective word lines according to an operation mode and voltages to be supplied to bulks (for example, well regions) formed with memory cells. The voltage generating operation of the voltage supply block 310 may be performed by the control of a control circuit (not shown). The voltage supply block 310 may generate a plurality of variable read voltages to generate a plurality of read data, select one of the memory blocks (or sectors) of a memory cell array in response to the control of the control circuit, select one of the word lines of the selected memory block, and provide the word line voltages to the selected word line and unselected word lines.

A read/write circuit 320 of the memory device 150 is controlled by the control circuit, and may operate as a sense amplifier or a write driver according to an operation mode. For example, in the case of a verify/normal read operation, the read/write circuit 320 may operate as a sense amplifier for reading data from the memory cell array. In the case of a program operation, the read/write circuit 320 may operate as a write driver which drives bit lines according to data to be stored in the memory cell array. In the program operation, the read/write circuit 320 may receive data to be written in the memory cell array, from a buffer (not shown), and may drive the bit lines according to inputted data. To this end, the read/write circuit 320 may include a plurality of page buffers (PB) 322, 324 and 326 respectively corresponding to columns (or bit lines) or pairs of columns (or pairs of bit lines), and a plurality of latches (not shown) may be included in each of the page buffers 322, 324 and 326.

Figure 4:
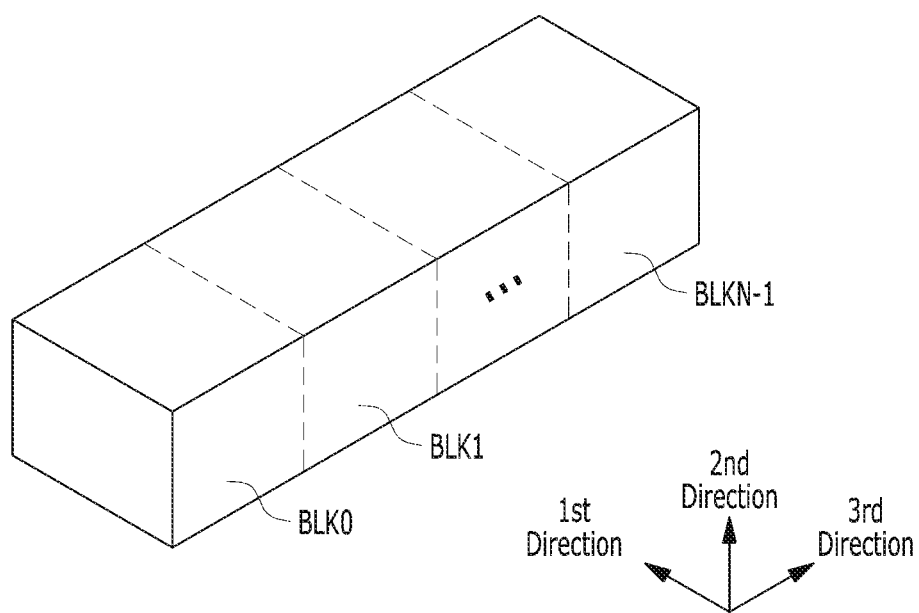
FIG. 4 is a schematic diagram illustrating a 3-D configuration of the memory blocks of the memory device of FIG. 1.

FIG. 4 is a schematic diagram illustrating a structure of the memory device 150 of FIG. 1.

The memory device 150 may be realized as a 2-dimensional or 3-dimensional memory device. Referring to FIG. 4, in the case where the memory device 150 is realized as a 3-dimensional nonvolatile memory device, the memory device 150 may include a plurality of memory blocks BLK0 to BLKN-1.

The memory blocks BLK0 to BLKN-1 may be realized as a 3-dimensional structure or a vertical structure. For example, the respective memory blocks BLK0 to BLKN-1 may be realized as a 3-dimensional structure by including a structure which extends in first to third directions (e.g., the x-axis direction, the y-axis direction and the z-axis direction).

The respective memory blocks BLK0 to BLKN-1 included in the memory device 150 may include a plurality of NAND strings which extend in the second direction. The plurality of NAND strings may be provided in the first direction and the third direction. Each NAND string may be coupled to a bit line (e.g., cell string 340 coupled to bit line BL0 of FIG. 3). A common source line CSL may be coupled to the source select transistor SST of each NAND string of a memory block as shown in FIG. 3. A plurality of NAND strings forming a memory block may be coupled to at least one drain select line DSL coupled to the gate of each drain select transistor DST, at least one source select line SSL coupled to the gate of each source select transistor SST, a plurality of word lines WL1 to WLn-1, at least one dummy word line WL0 and a common source line CSL. Each NAND string may include a plurality of transistor structures e.g., SST, DST, and MC0 to MCn-1 (see FIG. 3).

Namely, among the plurality of memory blocks BLK0 to BLKN-1 of the memory device 150, the respective memory blocks BLK0 to BLKN-1 may be coupled to a plurality of bit lines, a plurality of drain select lines, a plurality of source select lines, a plurality of word lines, a plurality of dummy word lines and a plurality of common source lines, and accordingly, may include a plurality of NAND strings. Also, in the respective memory blocks BLK0 to BLKN-1, a plurality of NAND strings may be coupled to one bit line, and a plurality of transistors may be realized in one NAND string. A drain select transistor of each NAND string may be coupled to a corresponding bit line, and a source select transistor of each NAND string may be coupled to the common source line. (See FIG. 3). A plurality of memory cells MC1 to MCn-1 may be provided between the drain select transistor DST and the source select transistor SST of each NAND string. Namely, in the plurality of memory blocks BLK0 to BLKN-1 of the memory device 150, a plurality of memory cells may be realized in each of the memory blocks BLK0 to BLKN-1.

Figure 5:
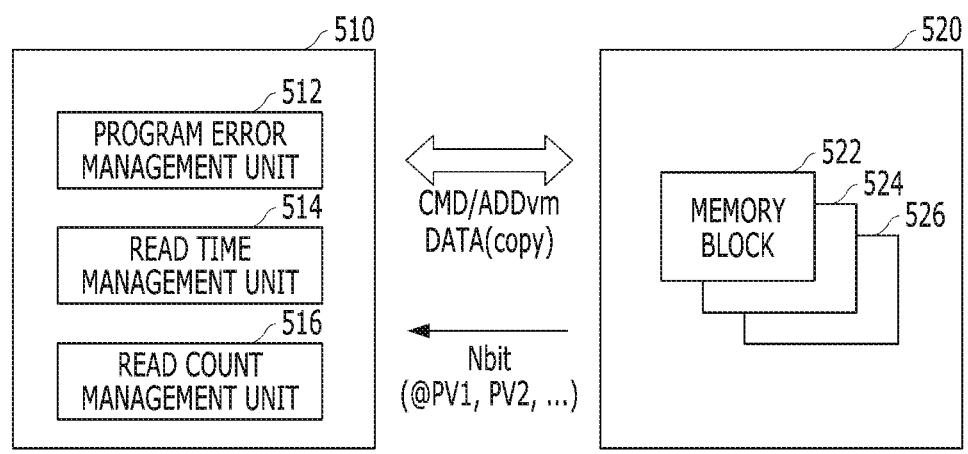
FIG. 5 is a block diagram illustrating a memory system, according to an embodiment of the present invention.
Figure 6:
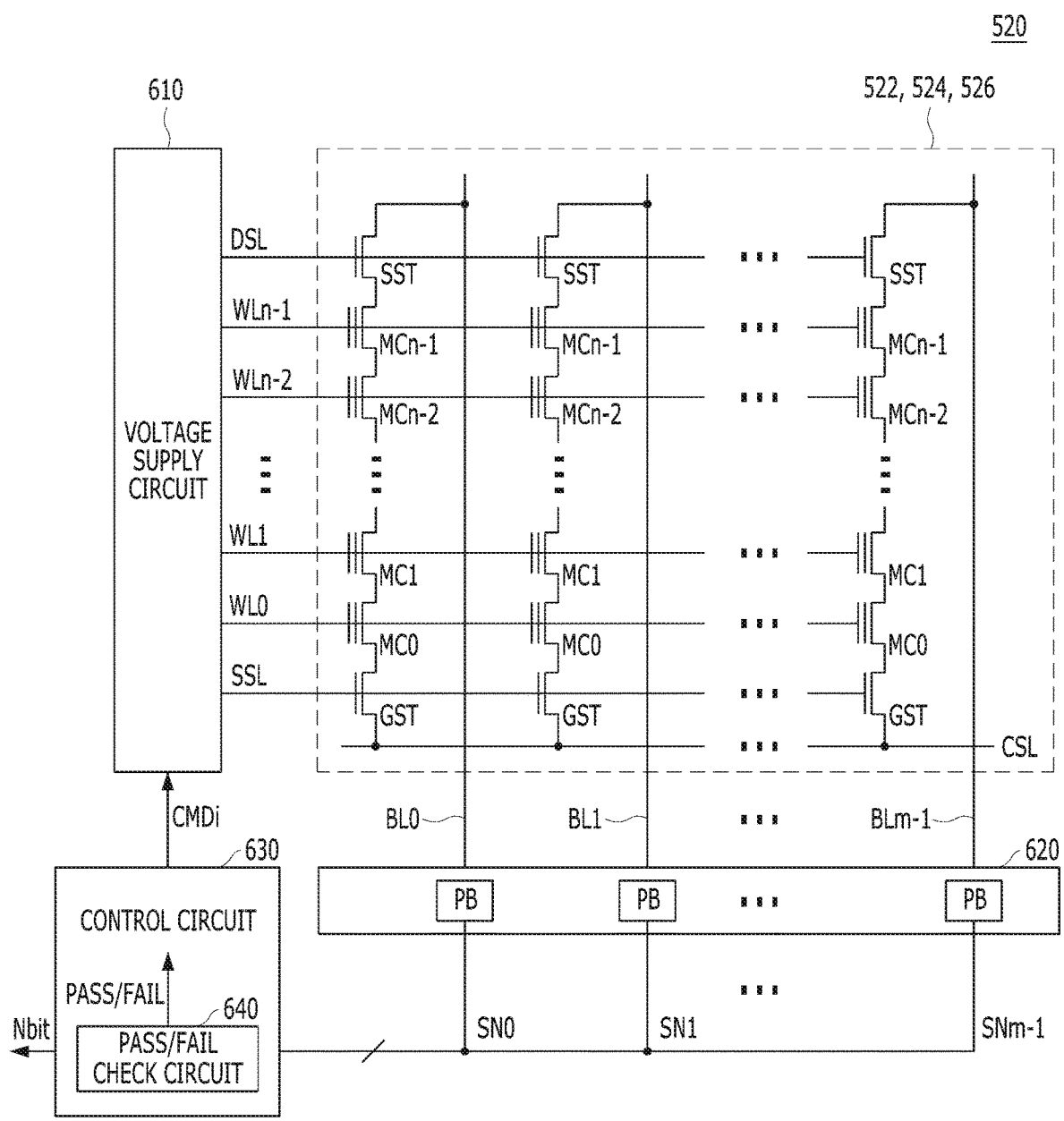
FIG. 6 is a more detailed block diagram illustrating the memory device of FIG. 5.
Figure 7:
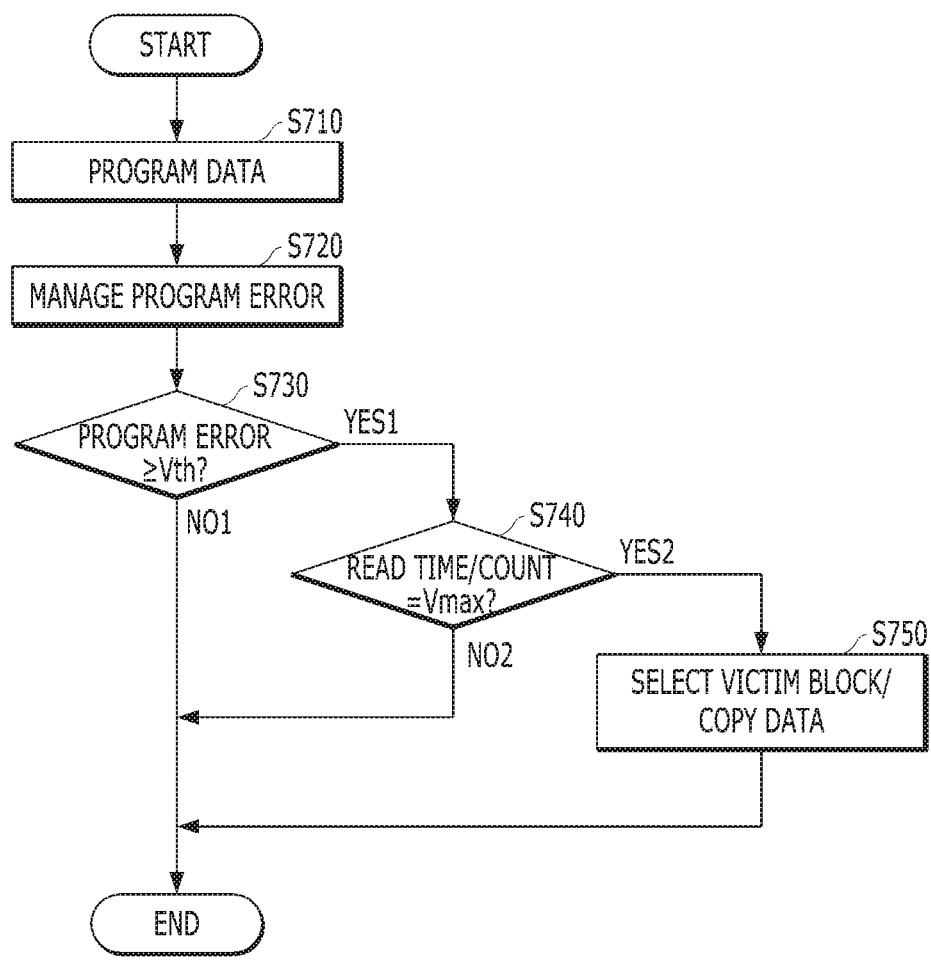
FIG. 7 is a flowchart illustrating an operation of a memory system according to an embodiment of the present invention.

Described hereafter is an operation of programming data to the memory device 150 and copying the programmed data in the memory system 110 of FIG. 1 in accordance with an embodiment of the present invention with reference to FIGS. 5 to 7.

FIG. 5 illustrates a memory system, according to an embodiment of the present invention.

Referring to FIG. 5, the memory system 500 includes a controller 510 and a memory device 520. The memory device 520 may include a plurality of memory blocks 522, 524 and 526. The memory system 500, the controller 510, the memory device 520 and the plurality of memory blocks 522, 524 and 526 may respectively correspond to the memory system 110, the controller 130, the memory device 150 and the plurality of memory blocks 152, 154 and 156 of FIG. 1. Hereinbelow, for the sake of convenience in explanation, although the memory device 520 is illustrated as being a nonvolatile memory device, that is, a NAND flash memory device, the present disclosure is not limited to this. As the nonvolatile memory device, there may be included a NOR flash memory device, a resistive random access memory (RRAM) device, a phase-change memory (PRAM) device, a magnetoresistive random access memory (MRAM) device, a ferroelectric random access memory (FRAM) device, and so forth.

The controller 510 controls the memory device 520 in response to a request from a host (not shown), in the same manner as that of the controller 130 shown in FIG. 1. That is, the controller 510 provides data read from the memory device 520 to the host, and stores data provided from the host in the memory device 520. For this, the controller 510 controls program, read, erase operations, etc. of the memory device 520. Therefore, the controller 510 may include the configuration of the controller 130 shown in FIG. 1.

In addition, the controller 510 may perform a background operation such as a read reclaim operation or the like with respect to the memory device 520. As requirement for high integration of the memory device 520 is increased, it becomes common that a plurality of memory blocks 522, 524 and 526 included in the memory device 520 are configured with multi-level cells (MLCs). Accordingly, intervals between threshold voltage distributions of the memory cells become dense. Therefore, to prevent data retention characteristics from deteriorating by lapse of time or prevent threshold voltage distributions from being changed due to interference between the memory cells, the controller 510 selects a victim memory block among the plurality of memory blocks 522, 524 and 526 of the memory device 520, and copies data of the victim memory block to a free memory block of the memory device 520.

To select the victim memory block among the plurality of memory blocks 522, 524 and 526, the controller 510 may include a plurality of management units, which may be implemented in the FTL driven in a processor (not shown) provided in the controller 510. For example, the processor may be the processor 134 of FIG. 1.

In accordance with the embodiment of FIG. 5, the controller 510 may include a program error management unit 512, a read time management unit 514 and a read count management unit 516.

The program error management unit 512 may receive program error bit information Nbit from the memory device 520. The program error bit information Nbit may be detected by the memory device 520 as a result of a program verify operation, which is performed to check whether a program operation of the memory device 520 is successful. The program error bit information Nbit may be or include the number of program error bits detected through the program verify operation for each page for which a program operation is performed. In this regard, when the program operation is finally verified as being successful, the number of detected program error bits may be provided as program error bit information Nbit. Alternatively, the program error bit information Nbit may further represent the number of program error bit detected through the program verify operation per program voltage PVn.

The program error management unit 512 may manage the number of program error bits of each page and sum up the numbers of program error bits of each page for the respective memory blocks 522, 524 and 526. Therefore, when a page is newly programmed or invalidated, the number of program error bits of the block which includes the newly programmed or invalidated page may be updated according to the newly programmed or invalidated page. That is, the number of program error bits of the block may be increased or decreased by the number of program error bits corresponding to the newly programmed or invalidated page. The program error bit information Nbit may be included in mapping information indicating a relationship between a logical address LA and a physical address PA of data stored in the plurality of memory blocks 522, 524 and 526.

The read time management unit 514 may measure the time it takes to perform a read operation to each memory block 522, 524 and 526, and update the read operation time with a newest value.

The read count management unit 516 may count a read operation count for each memory block 522, 524 and 526, which is the number of the performed read operations in each memory block 522, 524 and 526, and may update the read operation count with a newest value when a new read operation is performed.

The controller 510 may select a victim memory block among the plurality of memory blocks 522, 524 and 526 based on the program error bit information Nbit and at least one of the read operation time and the read operation count for each memory block. For example, the victim memory block may be the one having the longest read operation time or the largest read operation count among a plurality of memory blocks each having a number of program error bits greater than a threshold value. The controller 510 may select the victim block based on the above criteria and may then transmit to the memory device 520 an address ADDvm indicating the selected victim memory block together with a copy command CMD for copying the data DATA(copy) of the victim memory block to another memory block.

The program verify operation for verifying the program operation is performed in a manner similar to an actual read operation. Since the controller 510 selects a victim memory block based on error bit information detected through the program verify operation, an operation of checking an error through ECC (Error Correction Code) may be omitted during the data copy operation. Hereinafter, a program or program verify operation that is performed by the memory device 520 will be described in more detail with reference to FIG. 6.

FIG. 6 is a more detailed block diagram illustrating the memory device 520 shown in FIG. 5.

Referring to FIG. 6, the memory device 520 may include operating circuits 610 and 620 which perform a program operation, a read operation and an erase operation for the memory blocks 522, 524 and 526, and a control circuit 630 which controls the operating circuits 610 and 620. The configuration and operation of the operating circuits 610 and 620 are substantially the same as those of the voltage supply circuit 310 and the read/write circuit 310 described with reference to FIG. 3; therefore, detailed description thereof will be omitted.

The control circuit 630 in accordance with the embodiment of FIG. 6 may include a pass/fail check circuit 640. When the memory device 520 performs a program operation according to control of the controller 510, a program verify operation is also performed with the program operation. During the program verify operation, the pass/fail check circuit 640 counts memory cells in which the program operation has failed, and determines whether the number of counted failed memory cells or the number of program error bits is within an error-correctable range. In the case where the number of program error bits is within the error-correctable range, then the program operation is determined as successful (i.e., determined as a pass). In the case where the number of program error bits is out of the error-correctable range, the program operation is determined as fail (i.e., determined as a fail).

A plurality of page buffers PB of the read/write circuit 620 may be coupled to the programmed memory cells (for example, memory cells MC0 of the first row of the memory cell array) through corresponding bit lines BL0 to BLm−1 and may perform the program verify operation. During the program verify operation, verify data (which represent results of the program verify operation to the programmed memory cells MC0) are stored in the page buffers PB depending on a verification result of the programmed memory cells MC0. According to a result of the program verify operation or the verify data stored in the page buffers PB, the potentials of sense nodes SN0 to SNm−1 are maintained in a high level or changed to a low level. In the case where the verification result of the programmed memory cells MC0 represents a pass, verify data of "1" is stored and the sense nodes SN0 to SNm−1 may be changed to the low level. In the case where the verification result of the programmed memory cells MC0 represents a fail, verify data of "0" is stored and the sense nodes SN0 to SNm−1 may be maintained in the high level.

The pass/fail check circuit 640 compares a measured current according to the potential level of the sense nodes SN of the page buffers PB of the read/write circuit 620 with a reference current corresponding to the error-correctable range, and outputs a pass or fail signal (PASS/FAIL) according to a result of the comparison. For example, in the case where the measured current according to the potential level of the sense nodes SN is higher than the reference current corresponding to the error-correctable range, a fail signal FAIL is outputted, and in the case where the measured current is equal to or lower than the reference current, a pass signal PASS is outputted.

The control circuit 630 checks whether the program operation is successful depending on the pass/fail signal PASS/FAIL outputted from the pass/fail check circuit 640. The memory device 520 may perform the program operation in the Incremental Step Pulse Program (ISPP) manner in which a pulse-typed program voltage is gradually increased in stages. Therefore, in the case where the pass/fail check circuit 640 outputs a fail signal FAIL, the control circuit 630 may generate a control signal CMDi and control the voltage supply circuit 610 to increase the program voltage and to apply the increased program voltage to word lines WLn again. Until the program voltages are applied a predetermined number of times, the control circuit 630 may repeatedly control the voltage supply circuit 610 in response to fail signals FAIL. In the case where the pass/fail check circuit 640 outputs a fail signal FAIL even after program voltages are applied a number of times equal to the predetermined times, the control circuit 630 determines the program operation for the corresponding page as defective, and terminates the program operation.

In the case where the pass/fail check circuit 640 outputs the pass signal PASS before program voltages are applied a number of times equal to the predetermined times, the control circuit 630 determines the program operation for the corresponding page as successful.

However, although it is determined that the program operation is successful since a total number of error bits included in the programmed memory cells MC0 is within the error-correctable range, still there may be one or more program-failed ones (i.e., memory cells having error bits) among the programmed memory cells MC0, which is represented by the verify data stored in the page buffers PB.

When the program operation is determined as successful at a specific program voltage level, the control circuit 630 may detect the number of program error bits by counting a number of the sense nodes SN of a high level, i.e., a number of the verify data of "0" stored in the page buffers PB of the read/write circuit 620. Eventually the number of program error bits is detected as a result of the program verify operation, and this may be transmitted to the controller 510 as the program error bit information Nbit. The program error management unit 512 included in the controller 510 may stably copy data of the victim memory block having a relatively large number of program error bits based on the transmitted program error bit information Nbit, the read operation time, the read operation count and the program voltages.

FIG. 7 is a flowchart illustrating an operation of the memory system 500, according to an embodiment of the present invention.

Referring to FIG. 7, the operation may include step S710 of programming data, step S720 of managing a program error, step S730 of comparing the program error with a threshold value Vth, step S740 of comparing a read time/count with the maximum value, and step S750 of selecting a victim block and copying data of the victim block.

Hereinafter, each step will be described in further detail with reference to FIGS. 5 to 7.

At step S710, the controller 510 may program data DATA to the memory device 520 according to a request from the host 102. In response to a command CMD and an address ADD that are transmitted from the controller 510, the memory device 520 may program the data DATA to a region corresponding to the address ADD (e.g., the memory cells MC0). In this regard, the memory device 520 may perform a program verify operation each time a program operation is performed. That is, the memory device 520 may detect the program error bits in the programmed memory cells MC0, and the number of detected program error bits is compared with the error-correctable range. Thereby, the memory device 520 may determine whether the program operation is successful. The memory device 520 may provide the controller 510 with the program error bit information Nbit obtained through the program verify operations.

At step S720, the program error management unit 512 included in the controller 510 may manage the provided program error bit information Nbit per page to which the program operation is performed. Furthermore, the program error management unit 512 may sum up the numbers of program error bits of each page for each of the respective memory blocks 522, 524 and 526. Therefore, as the program operation of the memory device 520 is performed, the numbers of program error bits of the respective memory blocks 522, 524 and 526 may be updated.

At step S730, the controller 510 may compare the number of program error bits of the respective memory blocks 522, 524 and 526 with a preset threshold value Vth.

Step S740 may be performed to one or more memory blocks each having a number of program error bits equal to or greater than the threshold value Vth among the memory blocks 522, 524 and 526. At step S740, the read time management unit 514 or the read count management unit 516 of the controller 510 may check and compare the read operation times or the read operation counts of the memory blocks each having the number of program error bits equal to or greater than the threshold value Vth.

Step S750 may be performed to a memory block that has a read operation time/count as a maximum value Vmax, among the memory blocks each having the number of program error bits equal to or greater than the threshold value Vth. At step S750, the controller 510 may select the memory block that has the maximum read operation time/count as the victim block, and copy data of the victim memory block to a free memory block.

During the copy operation, the controller 510 may control the memory device 520 to read the data of the victim memory block, and then to program the read data to the free memory block again. In this regard, the controller 510 may omit an ECC operation for the data read from the victim memory block.

Furthermore, the controller 510 may perform a garbage collection operation by copying only valid data from the victim memory block with reference to mapping information indicating the relation between a logical address LA and a physical address PA.

FIGS. 8 to 13 are diagrams illustrating various application examples of the memory system 110 according to an embodiment of the present invention.

Figure 8:
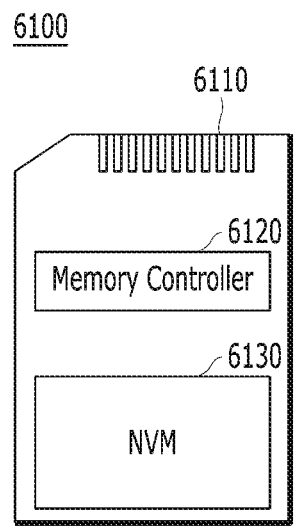
FIG. 8 is a diagram illustrating a memory card system, according to an embodiment of the present invention.

FIG. 8 is a diagram illustrating a memory card system 6100 as the data processing system described above with reference to FIGS. 1 to 7.

Referring to FIG. 8, the memory card system 6100 includes a memory controller 6120, a memory device 6130, and a connector 6110.

In detail, the memory controller 6120 may be connected with the memory device 6130 and may access the memory device 6130. In some embodiments, the memory device 6130 may be implemented with a nonvolatile memory (NVM). For example, the memory controller 6120 may control read, write, erase and background operations for the memory device 6130. The memory controller 6120 may provide an interface between the memory device 6130 and a host (not shown), and may drive a firmware for controlling the memory device 6130. For example, the memory controller 6120 may correspond to the controller 130 in the memory system 110 described above with reference to FIG. 1, and the memory device 6130 may correspond to the memory device 150 in the memory system 110 described above with reference to FIG. 1.

Therefore, the memory controller 6120 may include components such as a random-access memory (RAM), a processing unit, a host interface, a memory interface and an error correction unit as shown in FIG. 1.

The memory controller 6120 may communicate with an external device (for example, the host 102 described above with reference to FIG. 1), through the connector 6110. For example, as described above with reference to FIG. 1, the memory controller 6120 may be configured to communicate with the external device through at least one of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (ESDI), Integrated Drive Electronics (IDE), Firewire, universal flash storage (UFS), wireless-fidelity (WI-FI) and Bluetooth. The memory system and the data processing system according to an embodiment may be applied to wired and/or wireless electronic appliances, for example, a mobile electronic appliance.

The memory device 6130 may be implemented with a nonvolatile memory. For example, the memory device 6130 may be implemented with various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device. For example, the memory controller 6120 and the memory device 6130 may construct a solid-state driver (SSD) by being integrated into a single semiconductor device. The memory controller 6120 and the memory device 6130 may construct a memory card such as a PC card (PCMCIA: Personal Computer Memory Card International Association), a compact flash card (CF), a smart media card (SM and SMC), a memory stick, a multimedia card (MMC, RS-MMC, MMCmicro and eMMC), an SD card (e.g., SD, miniSD, microSD and SDHC) and a universal flash storage (UFS).

Figure 9:
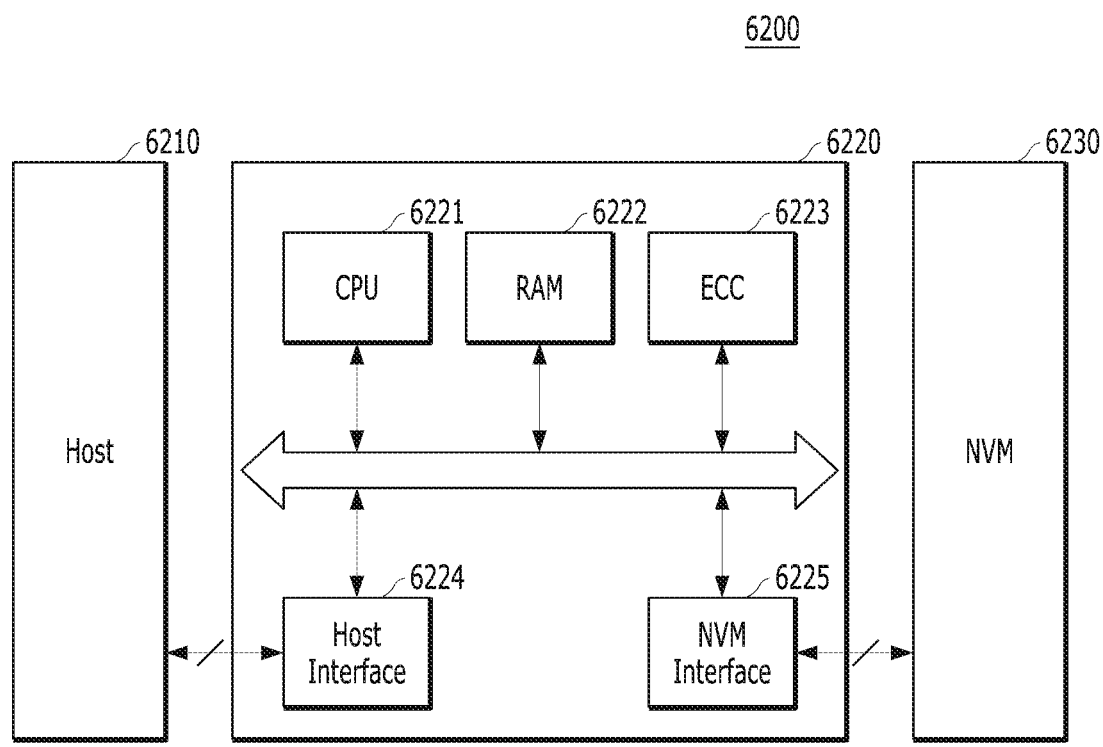
FIG. 9 is a block diagram illustrating a data processing system, according to an embodiment of the present invention.

FIG. 9 is a diagram schematically illustrating an example of a data processing system 6200 including a memory system according to an embodiment of the present invention.

Referring to FIG. 9, the data processing system 6200 may include a memory device 6230 which is implemented with at least one nonvolatile memory (NVM) and a memory controller 6220 for controlling the memory device 6230. The data processing system 6200 may be a storage medium such as a memory card (e.g., CF, SD and microSD), as described above with reference to FIG. 1. The memory device 6230 may correspond to the memory device 150 in the memory system 110 described above with reference to FIG. 1, and the memory controller 6220 may correspond to the controller 130 in the memory system 110 described above with reference to FIG. 1.

The memory controller 6220 may control the operations, including the read, write and erase operations for the memory device 6230 in response to requests provided from a host 6210. The memory controller 6220 may include a central processing unit (CPU) 6221, a random access memory (RAM) as a buffer memory 6222, an error correction code (ECC) circuit 6223, a host interface 6224, and an NVM interface as a memory interface 6225, all coupled via an internal bus.

The CPU 6221 may control the operations for the memory device 6230 such as read, write, file system management, bad page management, and so forth. The RAM 6222 may operate according to control of the CPU 6221, and may be used as a work memory, a buffer memory, a cache memory, or the like. In the case where the RAM 6222 is used as a work memory, data processed by the CPU 6221 is temporarily stored in the RAM 6222. In the case where the RAM 6222 is used as a buffer memory, the RAM 6222 is used to buffer data to be transmitted from the host 6210 to the memory device 6230 or from the memory device 6230 to the host 6210. In the case where the RAM 6222 is used as a cache memory, the RAM 6222 may be used to enable the memory device 6230 with a low speed to operate at a high speed.

The ECC circuit 6223 may correspond to the ECC unit 138 of the controller 130 described above with reference to FIG. As described above with reference to FIG. 1, the ECC circuit 6223 may generate an error correction code (ECC) for correcting a fail bit or an error bit in the data received from the memory device 6230. The ECC circuit 6223 may perform error correction encoding for data to be provided to the memory device 6230, and may generate data added with parity bits. The parity bits may be stored in the memory device 6230. The ECC circuit 6223 may perform error correction decoding for data outputted from the memory device 6230. At this time, the ECC circuit 6223 may correct errors by using the parity bits. For example, as described above with reference to FIG. 1, the ECC circuit 6223 may correct errors by using various coded modulations such as of a low-density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM) and a Block coded modulation (BCM).

The memory controller 6220 transmits and receives data to and from the host 6210 through the host interface 6224, and transmits and receives data to and from the memory device 6230 through the NVM interface 6225. The host interface 6224 may be connected with the host 6210 through at least one of various interface protocols such as a parallel advanced technology attachment (PATA) bus, a serial advanced technology attachment (SATA) bus, a small computer system interface (SCSI), a universal serial bus (USB), a peripheral component interconnection express (PCIe) or a NAND interface. Further, as a wireless communication function or a mobile communication protocol such as wireless fidelity (WI-FI) or long term evolution (LTE) is realized, the memory controller 6220 may transmit and receive data by being connected with an external device such as the host 6210 or another external device other than the host 6210. Specifically, as the memory controller 6220 is configured to communicate with an external device through at least one among various communication protocols, the memory system and the data processing system according to the embodiment may be applied to wired and/or wireless electronic appliances, for example, a mobile electronic appliance.

Figure 10:
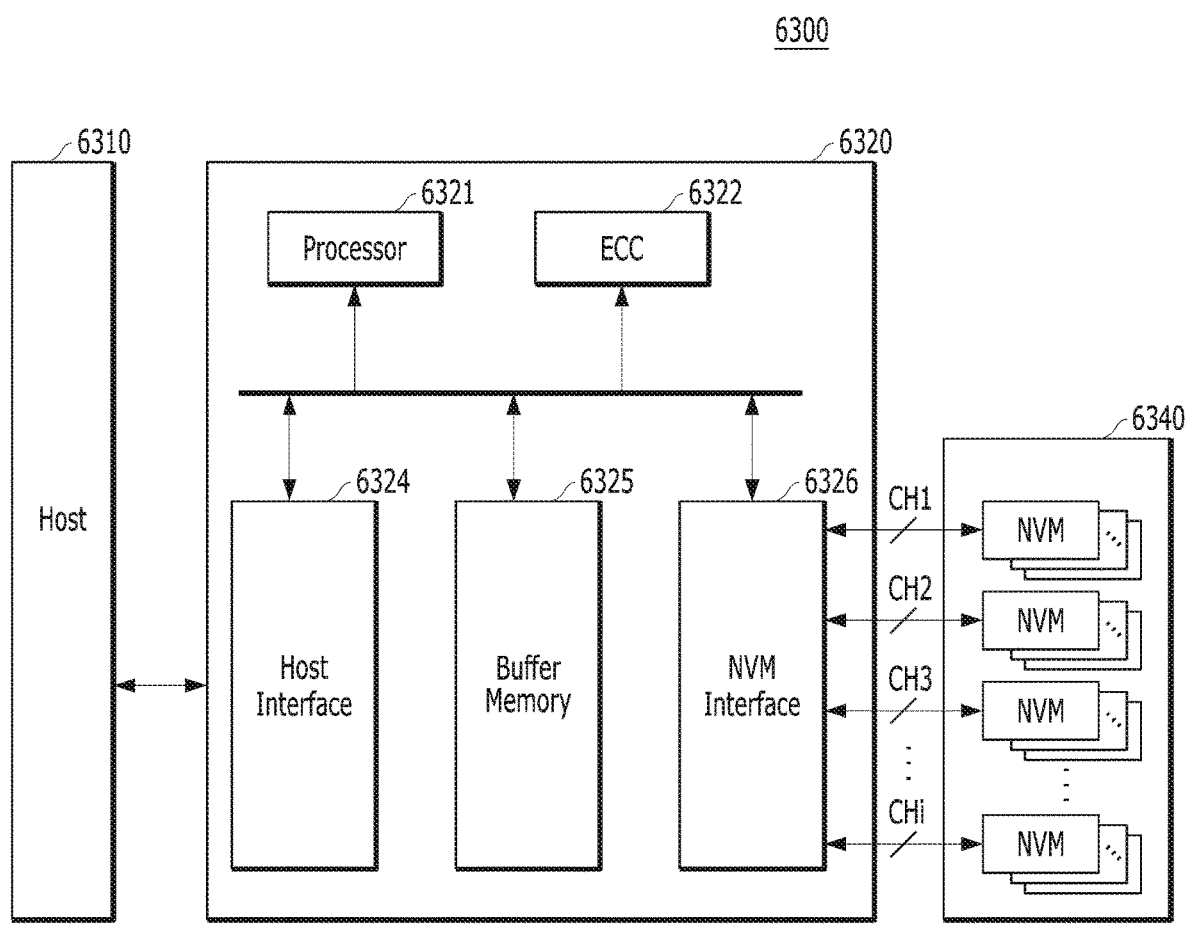
FIG. 10 is a block diagram illustrating a solid-state drive (SSD), according to an embodiment of the present invention.

FIG. 10 is a diagram illustrating an example of a data processing system including a memory system according to an embodiment of the present invention. FIG. 10 illustrates a solid-state drive (SSD) 6300.

Referring to FIG. 10, the SSD 6300 may include a memory device 6340 which may include a plurality of nonvolatile memories NVMs, and a controller 6320. The controller 6320 may correspond to the controller 130 in the memory system 110 described above with reference to FIG. 1, and the memory device 6340 may correspond to the memory device 150 in the memory system 110 described above with reference to FIG. 1.

In detail, the controller 6320 may be connected with the memory device 6340 through a plurality of channels CH1 to CHi. The controller 6320 may include a processor 6321, a buffer memory 6325, an error correction code (ECC) circuit 6322, a host interface 6324, and a nonvolatile memory (NVM) interface as a memory interface 6326 coupled via an internal bus.

The buffer memory 6325 temporarily stores data received from a host 6310 or data received from a plurality of nonvolatile memories NVMs included in the memory device 6340, or temporarily stores metadata of the plurality of nonvolatile memories NVMs. For example, the metadata may include map data including mapping tables. The buffer memory 6325 may be implemented with a volatile memory such as, but not limited to, a dynamic random access memory (DRAM), a synchronous dynamic random access memory (SDRAM), a double data rate (DDR) SDRAM, a low power double data rate (LPDDR) SDRAM and a graphic random access memory (GRAM) or a nonvolatile memory such as, but not limited to, a ferroelectric random access memory (FRAM), a resistive random access memory (ReRAM), a spin-transfer torque magnetic random access memory (STT-MRAM) and a phase change random access memory (PRAM). While it is illustrated in FIG. 10, for the sake of convenience in explanation, that the buffer memory 6325 is disposed inside the controller 6320, it is to be noted that the buffer memory 6325 may be disposed outside the controller 6320.

The ECC circuit 6322 calculates error correction code values of data to be programmed in the memory device 6340 in a program operation, performs an error correction operation for data read from the memory device 6340, based on the error correction code values, in a read operation, and performs an error correction operation for data recovered from the memory device 6340 in a recovery operation for failed data.

The host interface 6324 provides an interface function with respect to an external device such as the host 6310. The nonvolatile memory interface 6326 provides an interface function with respect to the memory device 6340 which is connected through the plurality of channels CH1 to CHi.

As a plurality of SSDs 6300 to each of which the memory system 110 described above with reference to FIG. 1 is applied are used, a data processing system such as a redundant array of independent disks (RAID) system may be implemented. In the RAID system, the plurality of SSDs 6300 and an RAID controller for controlling the plurality of SSDs 6300 may be included. In the case of performing a program operation by receiving a write command from the host 6310, the RAID controller may select at least one memory system (for example, at least one SSD 6300) in response to the RAID level information of the write command received from the host 6310, among a plurality of RAID levels (for example, the plurality of SSDs 6300) and may output data corresponding to the write command, to the selected SSD 6300. In the case of performing a read operation by receiving a read command from the host 6310, the RAID controller may select at least one memory system (for example, at least one SSD 6300) in response to the RAID level information of the write command received from the host 6310, among the plurality of RAID levels (for example, the plurality of SSDs 6300), and may provide data outputted from the selected SSD 6300, to the host 6310.

Figure 11:
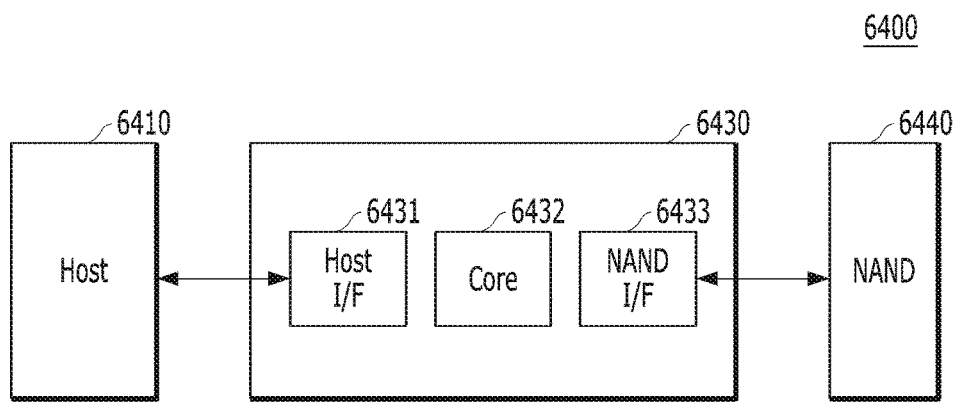
FIG. 11 is a block diagram illustrating an embedded multimedia card (eMMC), according to an embodiment of the present invention.

FIG. 11 is a diagram illustrating another example of a data processing system including the memory system, according to an embodiment of the present invention. FIG. 11 is a drawing schematically illustrating an embedded multimedia card (eMMC) 6400 to which a memory system according to an embodiment is applied.

Referring to FIG. 11, the eMMC 6400 includes a memory device 6440 which is implemented with at least one NAND flash memory, and a controller 6430. The controller 6430 may correspond to the controller 130 in the memory system 110 described above with reference to FIG. 1, and the memory device 6440 may correspond to the memory device 150 in the memory system 110 described above with reference to FIG. 1.

In detail, the controller 6430 may be connected with the memory device 6440 through a plurality of channels. The controller 6430 may include a core 6432, a host interface 6431, and a memory interface such as a NAND interface 6433.

The core 6432 may control the operations of the eMMC 6400. The host interface 6431 may provide an interface function between the controller 6430 and a host 6410. The NAND interface 6433 may provide an interface function between the memory device 6440 and the controller 6430. For example, the host interface 6431 may be a parallel interface such as an MMC interface, as described above with reference to FIG. 1, or a serial interface such as an ultra-high speed class 1 (UHS-I)/UHS class 2 (UHS-II) and a universal flash storage (UFS) interface.

Figure 12:
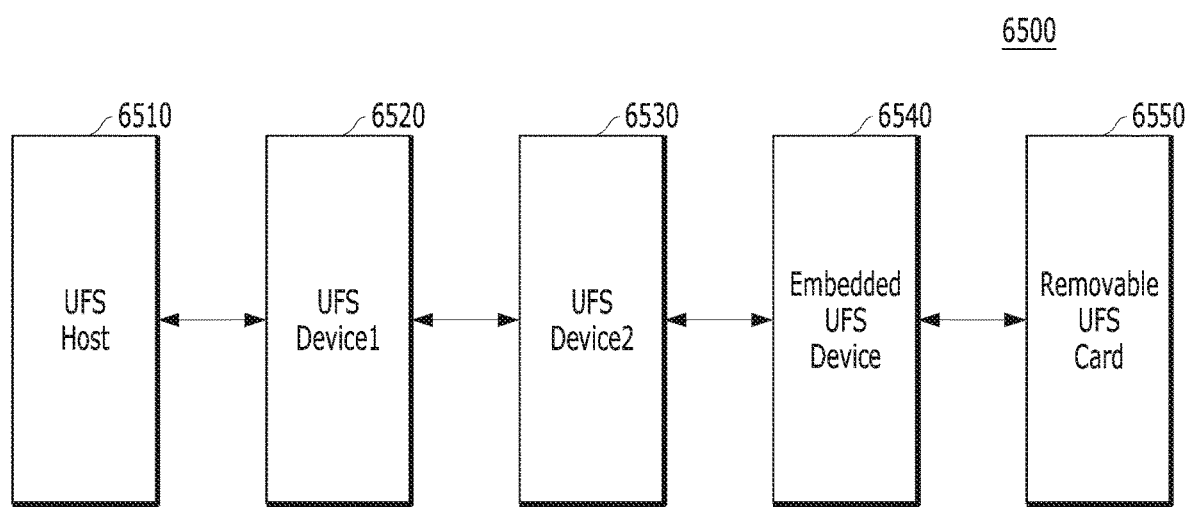
FIG. 12 is a block diagram illustrating a universal flash storage (UFS), according to an embodiment of the present invention.

FIG. 12 is a diagram illustrating another example of a data processing system including a memory system according to an embodiment of the present invention. FIG. 12 is a drawing schematically illustrating a universal flash storage (UFS) system 6500 to which the memory system according to the embodiment is applied.

Referring to FIG. 12, the UFS system 6500 may include a UFS host 6510, a plurality of UFS devices 6520 and 6530, an embedded UFS device 6540, and a removable UFS card 6550. The UFS host 6510 may be an application processor of wired and/or wireless electronic appliances, for example, a mobile electronic appliance.

The UFS host 6510, the UFS devices 6520 and 6530, the embedded UFS device 6540 and the removable UFS card 6550 may respectively communicate with external devices such as wired and/or wireless electronic appliances (for example, a mobile electronic appliance), through a UFS protocol. The UFS devices 6520 and 6530, the embedded UFS device 6540 and the removable UFS card 6550 may be implemented with the memory system 110 described above with reference to FIG. 1, for example, as the memory card system 6100 described above with reference to FIG. 8. The embedded UFS device 6540 and the removable UFS card 6550 may communicate through another protocol other than the UFS protocol. For example, the embedded UFS device 6540 and the removable UFS card 6550 may communicate through various card protocols such as, but not limited to, USB flash drives (UFDs), multimedia card (MMC), secure digital (SD), mini SD and Micro SD.

Figure 13:
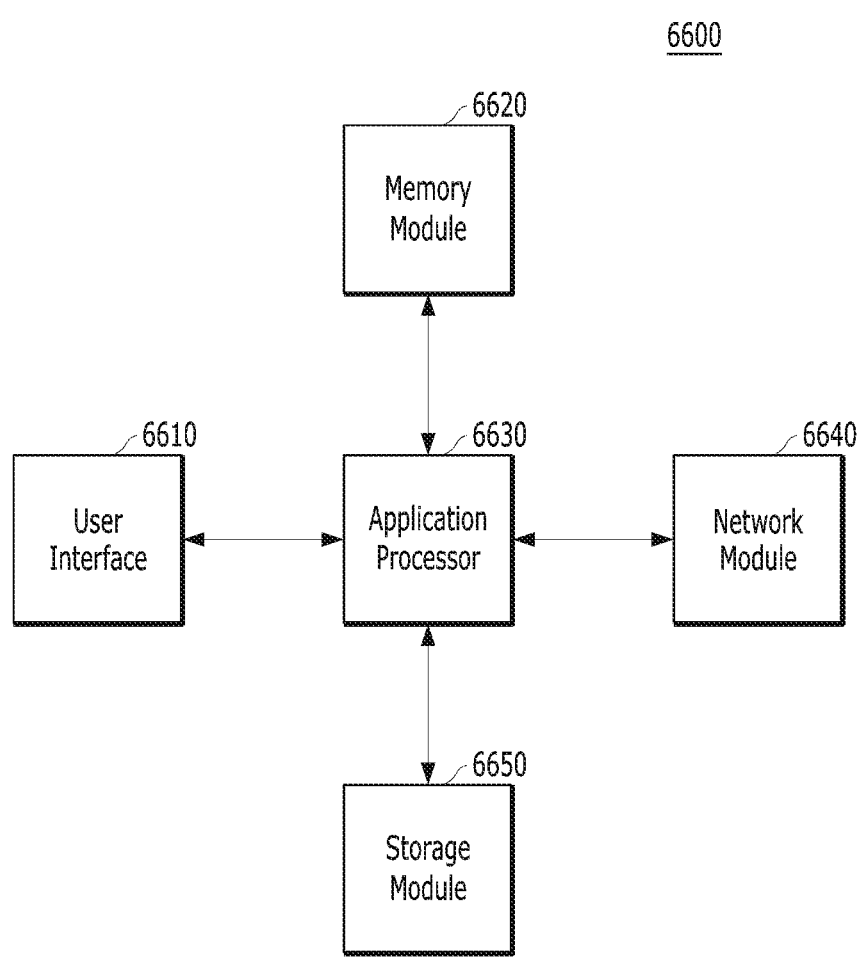
FIG. 13 is a block diagram illustrating a user system including a memory system, according to an embodiment of the present invention.

FIG. 13 is a diagram illustrating an example of a data processing system including the memory system according to an embodiment of the present invention. FIG. 13 is a drawing schematically illustrating a user system 6600 to which the memory system according to the embodiment is applied.

Referring to FIG. 13, the user system 6600 may include an application processor 6630, a memory module 6620, a network module 6640, a storage module 6650, and a user interface 6610.

The application processor 6630 may drive the various components which are included in the user system 6600 and an operating system (OS). For example, the application processor 6630 may include controllers for controlling the various components which are included in the user system 6600, such as interfaces, graphics engines, and so on. The application processor 6630 may be provided by a system-on-chip (SoC).

The memory module 6620 may operate as a main memory, a working memory, a buffer memory or a cache memory of the user system 6600. The memory module 6620 may include a volatile random access memory such as a dynamic random access memory (DRAM), a synchronous dynamic random access memory (SDRAM), a double data rate (DDR) SDRAM, a DDR2 SDRAM, a DDR3 SDRAM, a low power double data rate (LPDDR) SDRAM, an LPDDR2 SDRAM and an LPDDR3 SDRAM or a nonvolatile random access memory such as a phase change random access memory (PRAM), a resistive random access memory (ReRAM), a magnetic random access memory (MRAM) and a ferroelectric random access memory (FRAM). For example, the application processor 6630 and the memory module 6620 may be mounted by being packaged on the basis of a package-on-package (POP).

The network module 6640 may communicate with external devices. For example, the network module 6640 may support not only wired communications but also various wireless communications such as code division multiple access (CDMA), global system for mobile communication (GSM), wideband CDMA (WCDMA), CDMA-2000, time division multiple access (TDMA), long term evolution (LTE), worldwide interoperability for microwave access (WiMAX), wireless local area network (WLAN), ultra-wideband (UWB), Bluetooth, wireless display (WI-DI), and so on, and may thereby communicate with wired and/or wireless electronic appliances, for example, a mobile electronic appliance. Hence, the memory system and the data processing system may be applied to wired and/or wireless electronic appliances. The network module 6640 may be included in the application processor 6630.

The storage module 6650 may store data such as data received from the application processor 6630. The storage module 6650 may also transmit data stored therein to the application processor 6630. The storage module 6650 may be realized by a nonvolatile semiconductor memory device such as a phase-change RAM (PRAM), a magnetic RAM (MRAM), a resistive RAM (ReRAM), a NAND flash memory, a NOR flash memory and a 3-dimensional NAND flash memory. The storage module 6650 may be provided as a removable storage medium such as a memory card of the user system 6600 and an external drive. For example, the storage module 6650 may correspond to the memory system 110 described above with reference to FIG. 1, and may be implemented with the SSD, eMMC and UFS described above with reference to FIGS. 10 to 12.

The user interface 6610 may include interfaces for inputting data or commands to the application processor 6630 or for outputting data to an external device. For example, the user interface 6610 may include a user input interface such as a keyboard, a keypad, a button, a touch panel, a touch screen, a touch pad, a touch ball, a camera, a microphone, a gyroscope sensor, a vibration sensor and a piezoelectric element, and a user output interface such as a liquid crystal display (LCD), an organic light emitting diode (OLED) display device, an active matrix OLED (AMOLED) display device, a light emitting diode (LED), a speaker and a motor.

In the case where the memory system 110 described above with reference to FIG. 1 is applied to the mobile electronic appliance of the user system 6600 according to an embodiment, the application processor 6630 may control the operations of the mobile electronic appliance, and the network module 6640 as a communication module may control wired and/or wireless communication with an external device, as described above. The user interface 6610 as the display/touch module of the mobile electronic appliance displays data processed by the application processor 6630 or supports input of data from a touch panel.

In a memory system and an operation method for the memory system in accordance with various embodiments of the present invention, error information detected when data is programmed to a memory device is managed, whereby corresponding data may be backed up. Therefore, an error which may occur during a data read operation may be prevented. In addition, because data is backed up, that is, read and programmed, based on the error information, an error detection and compensation operation for read data may be omitted. Consequently, the operating speed of the memory system may be enhanced, and an operating load of the memory system may be reduced.

While the present invention has been described with respect to specific embodiments, it will be apparent to those skilled in the art that various changes and modifications may be made without departing from the spirit and scope of the invention as defined in the following claims.

What is claimed is:

1. A memory system comprising:
   a memory device including a plurality of memory blocks, the memory device being configured to perform a program operation and a program verify operation to program data to the memory blocks and detect a number of program error bits for a page of the respective memory blocks by counting a program-failed memory cell of the page within an error-correctable range, the program operation of the page being verified as successful, and being configured to provide the detected number of program error bits of the page as program error bit information; and
   a controller configured to manage the program error bit information by summing up the numbers of program error bits of the page for the respective memory blocks, select a victim memory block among the memory blocks based on the program error bit information, and copy programmed data of the victim memory block.

2. The memory system of claim 1, wherein the controller comprises a program error management unit configured to manage the number of program error bits of the page, and sum up the number of program error bits of the page for the respective memory blocks.

3. The memory system of claim 2, wherein the controller further comprises:
a read time management unit configured to measure a read operation time for a read operation performed for the respective memory blocks; and
a read count management unit configured to count a read operation count for the read operation performed for the respective memory blocks.

4. The memory system of claim 3, wherein the controller selects the victim memory block among the plurality of memory blocks based on the number of program error bits and on at least one of the read operation time and the read operation count.

5. The memory system of claim 4, wherein the controller selects a memory block having a longest read operation time or a largest read operation count and having the number of program error bits equal to or more than a threshold value as the victim memory block among the plurality of memory blocks.

6. The memory system of claim 1, wherein when copying the data of the victim memory block, the controller reads the data of the victim memory block and programs the read data to a free memory block among the plurality of memory blocks without performing an ECC (Error Correction Code) operation.

7. The memory system of claim 6, wherein, when reading the data of the victim memory block, the controller reads valid data among the data of the victim memory block through a garbage collection operation.

8. The memory system of claim 1, wherein the memory device comprises:
a voltage supply circuit configured to supply an operating voltage to the memory blocks according to the program operation or the program verify operation;
a read/write circuit configured to drive and sense potentials of corresponding bit lines of the memory blocks according to the program operation or the program verify operation; and
a control circuit configured to control the voltage supply circuit and the read/write circuit.

9. The memory system of claim 8,
wherein the read/write circuit includes a plurality of page buffers coupled with memory cells through the corresponding bit lines, and
wherein, during the program verify operation, the page buffers change potentials of a plurality of sense nodes depending on a verification result of corresponding memory cells.

10. The memory system of claim 9, wherein, during the program verify operation, the control circuit counts sense nodes that are not changed in potential among the plurality of sense nodes, and determines whether the program operation is successful by comparing the number of counted sense nodes with a reference number of bits.

11. The memory system of claim 9, wherein, during the program verify operation, the control circuit counts sense nodes that are not changed in potential among the plurality of sense nodes, and outputs the number of counted sense nodes to the controller as the program error bit information.

12. An operating method for a memory system, comprising:
performing a program operation and a program verify operation to program data to a plurality of memory blocks and detect a number of program error bits for a page of the respective memory blocks by counting a program-failed memory cell of the page within an error-correctable range, the program operation of the page being verified as successful, and being configured to provide the detected number of program error bits of the page as program error bit information;
managing the program error bit information by summing up the number of program error bits of the page for the respective memory block;
selecting a victim memory block among the plurality of memory blocks based on the program error bit information; and
copying data of the victim memory block.

13. The operating method of claim 12, wherein the managing of the program error bit information comprises:
managing the number of program error bits of the page; and
summing up the numbers of program error bits of the page for the respective memory blocks.

14. The operating method of claim 13, wherein the selecting of the victim memory block comprises:
measuring a read operation time taken for the respective memory blocks, or counting a read operation count performed for the respective memory blocks;
selecting memory blocks having the number of program error bits equal to or more than a threshold value among the plurality of memory blocks; and
selecting a memory block having a longest read operation time or a largest read operation count as the victim memory block among the selected memory blocks.

15. The operating method of claim 14, wherein the copying of the data of the victim memory block is performed without performing an error correction operation to the data of the victim memory block.

16. The operating method of claim 15, wherein the copying of the data of the victim memory block is performed by copying valid data among the data of the victim memory block by a garbage collection operation.

17. A data processing system comprising:
a host operatively coupled to the memory system of claim 1,
wherein the memory system is configured as at least one of a solid-state drive, an embedded multimedia card, a universal flash storage, and a user system.

18. The data processing system of claim 17, wherein the memory device is a nonvolatile memory device selected from the group consisting of a read only memory (ROM), a mask ROM (MROM), a programmable ROM (PROM), an erasable programmable ROM (EPROM), an electrically erasable programmable ROM (EEPROM), a ferroelectric random access memory (FRAM), a phase-change RAM (PRAM), a magnetoresistive RAM (MRAM), a resistive RAM (RRAM), and a flash memory.

* * * * *